United States Patent
Hayashi

(10) Patent No.: US 7,268,003 B2
(45) Date of Patent: Sep. 11, 2007

(54) METHOD OF EVALUATING SEMICONDUCTOR DEVICE

(75) Inventor: Hirokazu Hayashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 349 days.

(21) Appl. No.: 11/002,338

(22) Filed: Dec. 3, 2004

(65) Prior Publication Data
US 2005/0196884 A1    Sep. 8, 2005

(30) Foreign Application Priority Data
Mar. 2, 2004    (JP)    ............... 2004-058178

(51) Int. Cl.
*H01L 21/66*    (2006.01)
(52) U.S. Cl. ............... 438/17; 438/14; 438/18; 257/355
(58) Field of Classification Search ............... 438/14, 438/17, 18; 257/355
See application file for complete search history.

(56) References Cited

U.S. PATENT DOCUMENTS 6,515,331 B1    2/2003  Carneiro et al.
6,581,028 B1    6/2003  Hayashi
6,611,025 B2    8/2003  Lin

FOREIGN PATENT DOCUMENTS

| JP | 06-053407  | 2/1994 |
| JP | 09-181267  | 7/1997 |
| JP | 2000-114521 | 4/2000 |
| JP | 2001-339052 | 12/2001 |

*Primary Examiner*—Douglas M. Menz
(74) *Attorney, Agent, or Firm*—Rabin & Berdo, P.C.

(57) ABSTRACT

The present invention provides a method of evaluating a semiconductor device having an ESD protective element, wherein a MOSFET is formed on the same substrate, comprising a step (electric characteristic measurement) for measuring an electric characteristic of the MOSFET, a step (snapback characteristic measurement) for measuring a snapback characteristic of the MOSFET, a step (impurity profile extraction) for extracting an impurity profile of the MOSFET from the electric characteristic and snapback characteristic of the MOSFET by using an inverse modeling technique, and a step (impurity profile adaptation) for causing the extracted impurity profile of the MOSFET and an impurity profile of the ESD protective element to correspond to each other, whereby the impurity profile of the ESD protective element is evaluated from the electric characteristic.

11 Claims, 7 Drawing Sheets

METHOD OF EVALUATING SEMICONDUCTOR DEVICE

BACKGROUND OF THE INVENTION

1. Field of the Invention

The present invention relates to a method of evaluating a semiconductor device, and particularly to an evaluating method of a semiconductor device, which evaluates an impurity profile of an ESD (Electric Static Discharge) protective element.

2. Description of the Related Art

In general, an ESD protective element 51 is inserted between an input electrode 52 or an output electrode 53 and an internal circuit 50 in a semiconductor device in such a manner that when an ESD surge is applied from the input electrode 52 or the output electrode 53 as shown in an input circuit (FIG. 6(a)) and an output circuit (FIG. 6(b)), an excessive current does not flow through the internal circuit 50.

When the voltage applied to the internal circuit or the current that flows through the internal circuit exceeds the rating, such a protective element is designed in such a manner that the current flows through the ESD protective element in a moment. Since elements contained in the ESD protective device and the internal circuit are fabricated in a similar process only for the protective element and so as not to increase the number of processes, impurity profiles of respective impurity layers constituting the protective element are identical to a layer constituting the internal circuit.

While a MOSFET, a PN diode or an SCR (Silicon Controlled Rectifier) is being used as the ESD protective element, the SCR among them has been widely used because it is small in hold voltage and low in on resistance. The small hold voltage makes it possible to reduce power consumption defined by the current x voltage, and the low on resistance allows the current to flow in the ESD protective element in a moment, thereby bringing about an effect that ESD resistance can be enhanced.

FIG. 7(a) is an explanatory diagram showing a schematic structure of a general SCR 60. A current flows from an anode 61 to a cathode 62 through a PD layer, an NW layer, a PW layer and an ND layer. A $P^+$ layer and an $N^+$ layer are respectively formed in the PD layer and the ND layer for the purpose of a reduction in resistance, and the NW layer is connected to the anode to control the current.

Although the SCR is accompanied by the drawback that a turn-on voltage (voltage at which the current starts to flow) is high, an LVTSCR (Low Voltage Triggering SCR) shown in FIG. 7(b) has been proposed and widely used to reduce the turn-on voltage. This is one wherein a MOS structure is provided adjacent to the SCR and when the potential of the NW layer rises with a drain D as floating, a MOSFET breaks down precedently to increase the injection of a base current, thereby making it possible to set a breakdown voltage of the SCR low.

In order to improve the performance of the SCR as the protective element, the SCR needed to reduce the on resistance and adjust the turn-on voltage. To this end, the design of impurity profiles of the SCR is very important, and there was a need to repeat feedback from its post-fabrication characteristic to impurity profile design and an element size on several occasions.

The SCR is constituted of complex impurity profiles. In order to extract these impurity profiles, profile extracting TEGs each corresponding to a process for diffusing respective layers (ion implanting process) were fabricated and the respective TEGs cut off from a wafer were evaluated by a method based on Secondary Ion Mass Spectrometry (SIMS) or the like. The SCR shown in FIG. 7(a), for example, needed to fabricate six SIMS TEGs for the PD layer, NW layer, PW layer, ND layer, $P^+$ layer and $N^+$ layer.

A patent document, i.e., Japanese Unexamined Patent Publication No. Hei 6(1994)-53407 has described a protection circuit in which inverters and capacitors are used as triggers to operate an LVTSCR. A patent document, i.e., Japanese Unexamined Patent Publication No. Hei 9(1997)-181267 has described a circuit which protects a memory circuit from a negative ESD surge where the back of a substrate is not grounded. A patent document, i.e., Japanese Unexamined Patent Publication No. Hei 12(2000)-114521 has described a method for extracting an impurity profile from the characteristic of an actual element or device without using a TEG. A patent document, i.e., Japanese Unexamined Patent Publication No. Hei 13(2001)-339052 has described a method of accurately performing simulation of a protection circuit from an equivalent circuit in which an FET of an ESD protective element is substituted with a bipolar transistor.

However, the above methods involved several problems respectively. There is a need to first analyze the ESD protective element and the internal circuit in a set to evaluate ESD resistance. However, device or element structures contained in those include not only an SCR but also various types such as a MOSFET, a PN diode, etc. In order to determine the final impurity profiles of these element structures, the impurity profiles must be extracted with respect to their elements, thus taking a lot of trouble over it.

Since the SCR corresponding to one ESD protective element constitutes a complex impurity profile, it is difficult to estimate the impurity profile from the electric characteristic of the SCR. A problem arises in that when TEGs for evaluating impurity profiles are inserted, the number of the TEGs increases as described above and hence a TEG area becomes large, and each of the impurity profiles do not necessarily coincide with an impurity profile of an actual element or device.

SUMMARY OF THE INVENTION

Therefore, the present invention has been made in view of such problems. It is an object of the present invention to provide an evaluating method of a semiconductor device, which is capable of evaluating an impurity profile of an ESD protective element from an electric characteristic on a non-destructive basis to extract the impurity profile of the ESD protective element.

According to one aspect of the present invention, for achieving the above object, there is provided a method of evaluating a semiconductor device, comprising the steps of measuring an electric characteristic of a MOSFET formed on the same substrate as the semiconductor device having an ESD protective element, measuring a snapback characteristic of the MOSFET, extracting an impurity profile (impurity concentration distribution) of the MOSFET from the electric characteristic and snapback characteristic of the MOSFET by an inverse modeling technique, and causing the extracted impurity profile of the MOSFET and an impurity profile of the ESD protective element to correspond to each other.

After the impurity profile of the MOSFET is extracted and caused to correspond to the impurity profile of the ESD protective element, the concentration and size of an impurity diffused layer of the ESD protective element may preferably be adjusted such that the snapback characteristic of the MOSFET can be reproduced into the ESD protective element.

In general, an ESD protective element added to an internal circuit is formed simultaneously with the formation of an impurity layer of the internal circuit. That is, a sectional structure of part of the ESD protective element is similar to a sectional structure of part of a MOSFET constituting the internal circuit. Thus, it is possible to form a discrete MOSFET on the same substrate as a semiconductor device having the ESD protective element, extract an impurity profile from the electric characteristic of the discrete MOSFET, and allow the impurity profile to correspond to an impurity diffused layer of the ESD protective element.

A method of determining an impurity profile of a MOSFET from its electric characteristic by using an inverse modeling technique has already been known. An impurity profile of a diffused layer below a gate electrode can be determined from a current-voltage subthreshold characteristic and a capacitance-voltage characteristic or the like.

Since, however, the inverse modeling technique does not take into consideration an impurity profile of a source-drain region, the present invention is characterized in that an impurity profile of a source-drain diffused layer of a MOSFET is extracted from a snapback characteristic used for evaluation of ESD resistance.

The snapback characteristic of the MOSFET is an I-V characteristic in which the gate and source voltages are fixed to 0V according to the TLP (Transmission Line Pulse) measurement and which represents operation loci of a drain voltage and a drain current. A breakdown voltage $V_B$ at which the current starts to flow, a hold voltage $V_H$ at which a predetermined current can be held, and an on resistance $R_{on}$ corresponding to the inclination of a curve are featured so as to determine the characteristic. It is preferable to obtain these. Here, the TLP measurement is to measure a voltage-current characteristic up to a large current region by using a pulse narrow in width.

It is known that the snapback characteristic changes with the concentration of a source-drain diffused layer, a source-drain resistance, a substrate resistance, etc. as parameters. An impurity profile of the source-drain diffused layer can be determined in reverse from the snapback characteristic.

The method of evaluating the impurity profiles by the conventional SIMS measurement or the like needed to fabricate impurity profile measuring TEGs a lot as a layer structure at the formation of an element becomes complex. However, if the evaluating method of the present invention is used, it is then unnecessary to build a plurality of TEGs in the same wafer and there is also no need to cut out the TEGs. Therefore, the evaluation of the impurity profile becomes easy and accurate, thus making it possible to realize an effective characteristic as a protective element.

While an SCR small in hold voltage and low in on resistance is being heavily used as the ESD protective element, the structure of an impurity diffused layer of the SCR is a complex layer structure comprising a P type layer and an N type layer. However, if at least an N channel MOSFET and a P channel MOSFET are provided one by one, impurity profiles of the P type layer and N type layer are extracted from their electric characteristics and are caused to correspond to the impurity diffused layer of the SCR, thereby making it possible to evaluate the impurity profile of the SCR easily and efficiently.

According to another aspect of the present invention, for achieving the above object, there is provided a method of evaluating a semiconductor device having an ESD protective element comprising at least two elements, comprising the steps of measuring electric characteristics of at least the two elements formed as discrete elements respectively, evaluating the measured electric characteristics of at least the two elements respectively, and connecting the respective discrete elements by a sub circuit.

When the ESD protective element is comprised of two or more elements, the characteristic thereof becomes complex and the evaluation thereof is difficult. Since it is easy to evaluate the elements as the discrete elements, they are first formed as discrete elements and connected by the sub circuit after the evaluation of their electric characteristics, whereby it is possible to allow them to function as the ESD protective element. Here, the evaluation of the respective discrete elements may be a method of extracting and evaluating an impurity profile from the electric characteristic of the above MOSFET.

Since the respective elements are connected after the elements are respectively evaluated as the discrete elements, three-dimensional differences in gate widths or element widths or the like are cut or divided and a two-dimensional analysis intended for a sectional structure can be performed, thus facilitating the analysis.

The elements that constitute the ESD protective element may be two elements of an SCR and a MOSFT. By connecting an ampere meter to the sub circuit, the current that flows through the sub circuit, and the voltage applied thereto can be monitored, whereby the influence between the respective elements can be evaluated.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 3 shows snapback characteristics, wherein

FIG. 6 is a circuit in which a general ESD protective element is configured, wherein

DETAILED DESCRIPTION OF THE PREFERRED EMBODIMENTS

Figure 1:
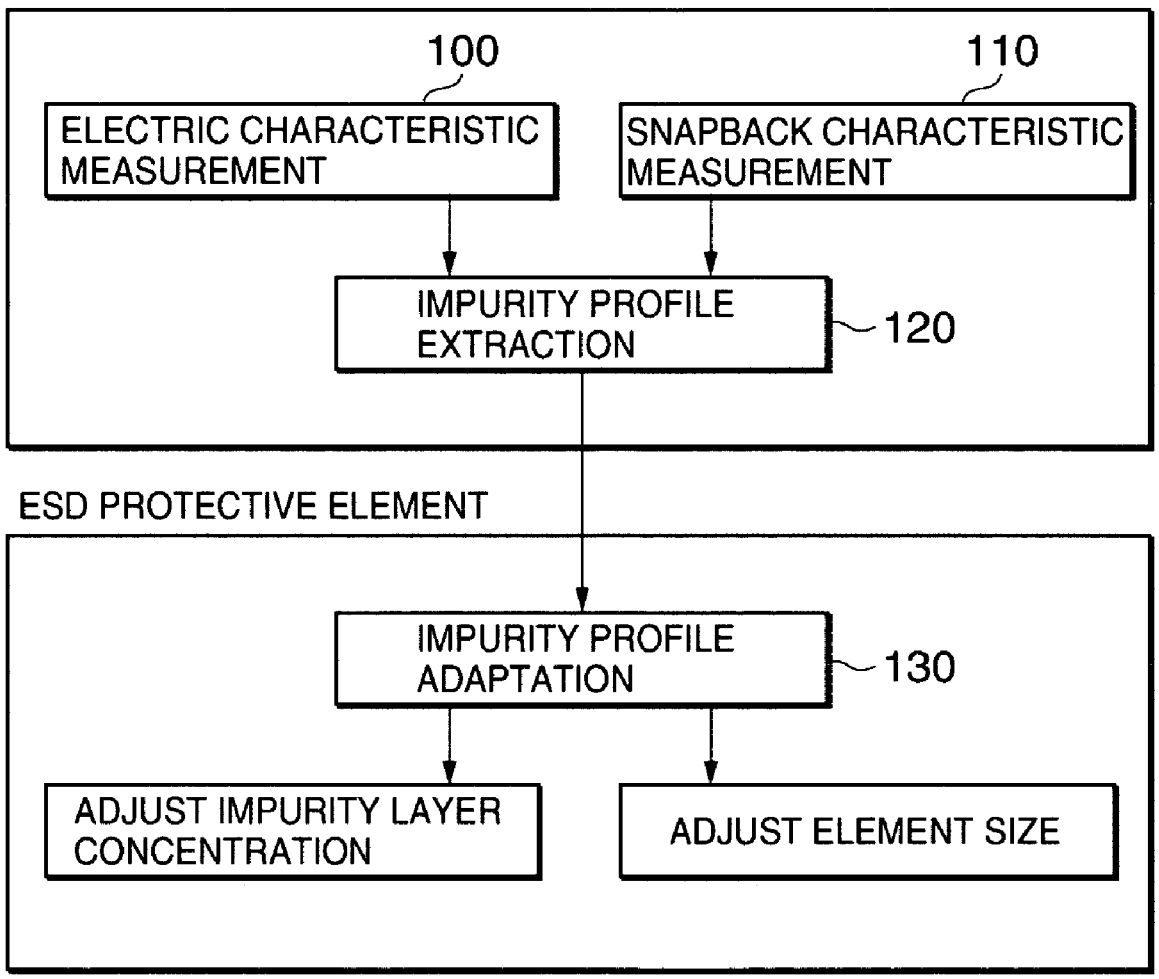
FIG. 1 illustrates a method of evaluating an impurity profile, showing a first embodiment of the present invention.

Preferred embodiments of the present invention will be explained hereinafter in detail with reference to the accompanying drawings. Elements of structure each having substantially the same functional constitution are given like reference numerals through this specification and figures, and dual explanations of the same elements are therefore avoided.

First Preferred Embodiment

FIG. 1 shows a method of evaluating an impurity profile of an ESD protective element, which corresponds to a method of evaluating a semiconductor device. The method of evaluating the semiconductor device is provided which includes a step (electric characteristic measurement 100) for measuring an electric characteristic of a MOSFET formed on the same substrate as the semiconductor device having the ESD protective element, a step (snapback characteristic measurement 110) for measuring a snapback characteristic of the MOSFET, a step (impurity profile extraction 120) for extracting an impurity profile of the MOSFET from the electric characteristic and snapback characteristic of the MOSFET by using an inverse modeling technique, and a step (impurity profile adaptation 130) for causing the extracted impurity profile of the MOSFET and the impurity profile of the ESD protective element to correspond to each other.

An SCR will subsequently be explained as an example as the ESD protective element. For example, an N channel MOSFET and a P channel MOSFET capable of measuring electric characteristics are respectively formed separately on the same wafer as a semiconductor circuit having an ESD protective element as an alternative to an impurity profile measuring TEG such as SIMS.

Figure 2A:
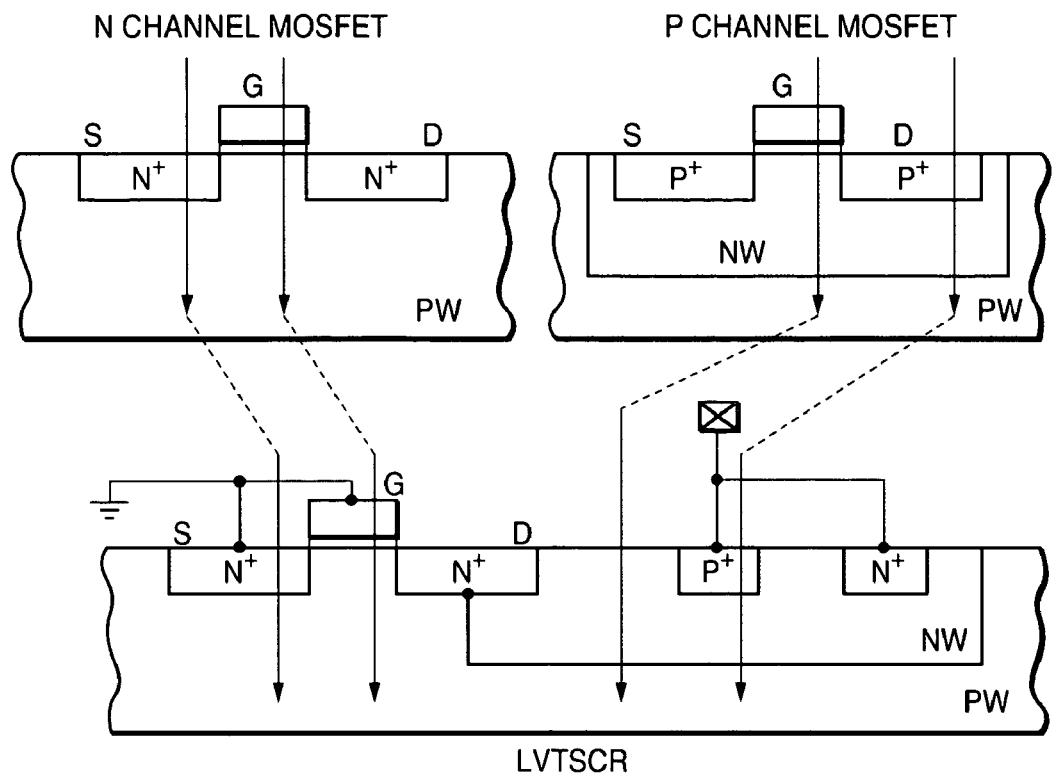
FIG. 2(a) is an explanatory diagram for comparing a sectional structure of an LVTSCR and sectional structures of P channel and N channel MOSFETs and FIG. 2(b) is an explanatory diagram showing a snapback characteristic.

An explanatory diagram for comparing a sectional structure of an LVTSCR combining the SCR with a MOS structure, and sectional structures of N channel and P channel MOSFETs is shown in FIG. 2(a). The SCR corresponding to the ESD protective element is formed simultaneously with the formation of an impurity layer of a MOSFET in an internal circuit. That is, a layer structure (N$^+$ layer, PW layer, P$^+$ layer and NW layer) having a section of part of the SCR, which is indicated by arrows, is similar to a sectional structure of part of the N channel MOSFET or the P channel MOSFET.

The N channel MOSFET and the P channel MOSFET are used and impurity profiles (PW layer and NW layer) of a channel layer below a gate G are first extracted from the electric characteristics of the MOSFETs by using an inverse modeling technique. The inverse modeling technique is the technique of measuring an electric characteristic of an element and extracting an impurity profile of the element from, for example, a capacitance-voltage characteristic and a current-voltage characteristic and enables extraction of impurity profiles of a channel region below a gate.

The concentration of the impurity layer of the channel layer located below the gate of the MOSFET is closely related to a curve inclination of a subthreshold characteristic such as Id-Vg, Id-Vd or the like. It is possible to measure a drain current Id with respect to a gate voltage Vg and a drain current with respect to a drain voltage Vd, each of which is indicative of a rise characteristic of a drain current with respect to a gate voltage, for example and determine the difference between work functions and mobility parameters. An analysis thereof is made from these electric characteristics and the concentration of the impurity layer can be estimated in reverse from data about characteristics with concentrations as parameters.

That is, the impurity profile of the P layer (PW layer) below the gate G can be extracted from the subthreshold characteristic of the N channel MOSFET. The impurity profile of the N layer (NW layer) below the gate G can be extracted from the subthreshold characteristic of the P channel MOSFET.

However, the inverse modeling technique does not take into consideration source and drain regions, so the impurity profiles of the source and drain regions could not be obtained. The present embodiment is characterized in that the snapback characteristic is obtained by the TLP measurement of a MOSFET in addition to the inverse modeling technique, and even impurity profiles of source and drain diffused layers are extracted from the snapback characteristic.

Here, the TLP measurement is intended to measure a voltage-current characteristic up to a large current region by use of a pulse narrow in width as mentioned previously. The TLP measurement is used upon measuring the snapback characteristic for evaluating by what voltage how much the ESD protective element can supply the ESD surge current. The snapback characteristic of the MOSFET is an I-V characteristic in which the gate and source voltages are fixed to 0V and which represents operation loci of the drain voltage and drain current.

Figure 2B:
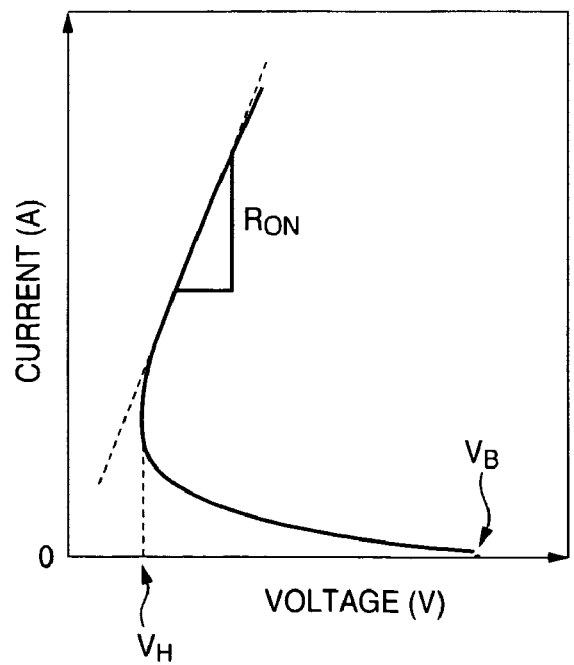

One example of the snapback characteristic is shown in FIG. 2(b). The example features that a breakdown voltage $V_B$ (turn-off voltage) at which the current starts to flow, a hold voltage $V_H$ (snapback voltage) at which a predetermined current can be held, and an on resistance $R_{on}$ corresponding to the inclination of a curve subsequent to snapback determine the characteristic. In the case of the SCR, the hold voltage is low and power consumption can be reduced. Further, the SCR is used heavily as the ESD protective element due to the reason why the on resistance is low and the current can be fed to the SCR in a moment.

It is known that as to the snapback characteristic of the MOSFET, the breakdown voltage $V_B$, the hold voltage $V_H$ and the on resistance $R_{on}$ change depending on parameters such as the concentration of a source-drain diffused layer, the depth of the source-drain diffused layer, an impact ionizing coefficient (coefficient that determines avalanche breakdown), a source-drain resistance, a substrate resistance, etc.

There is known a method of modeling a MOSFET using its snapback characteristic. As to the snapback characteristics of the MOSFET, a breakdown voltage depends on an impact ionizing coefficient and a hold voltage depends on a substrate resistance. An on resistance depends on a source-drain diffused layer and a source-drain resistance. The impurity concentration profile of the source-drain diffused layer can be evaluated from the resultant snapback characteristic, based on data about the above.

The modeling of the MOSFET using the snapback characteristic will now be explained. A MOSFET impurity profile is first determined by secondary ion mass spectrometry or the like to thereby obtain values of about several specific elements such as the concentration of a source-drain diffused layer, the depth thereof, an overlap length with respect to a gate, etc. Further, only respective parameters of an impact ionizing coefficient, a source-drain resistance and a substrate resistance are set.

Next, the snapback characteristic of an actual device actually measured by the TLP measurement and snapback characteristics corresponding to the specific elements are compared to set parameters of the specific elements. Described specifically, a specific element set from a specific element group is selected, and the locus of the actually measured snapback characteristic and the locus of a snapback characteristic corresponding to the selected specific element are compared in shape. The parameters are set in view of the fact that the locus of the snapback characteristic approaches the locus of the actually measured snapback characteristic if to which extent the parameters are set.

Finally, the set parameters of specific elements are simulated considering them together to thereby confirm whether the snapback characteristics of the specific elements are substantially equal to the actually measured snapback characteristic. Simply matching up parameters of about eight specific elements dependent on a change in process enables modeling of an ESD protective element.

Figure 3A:
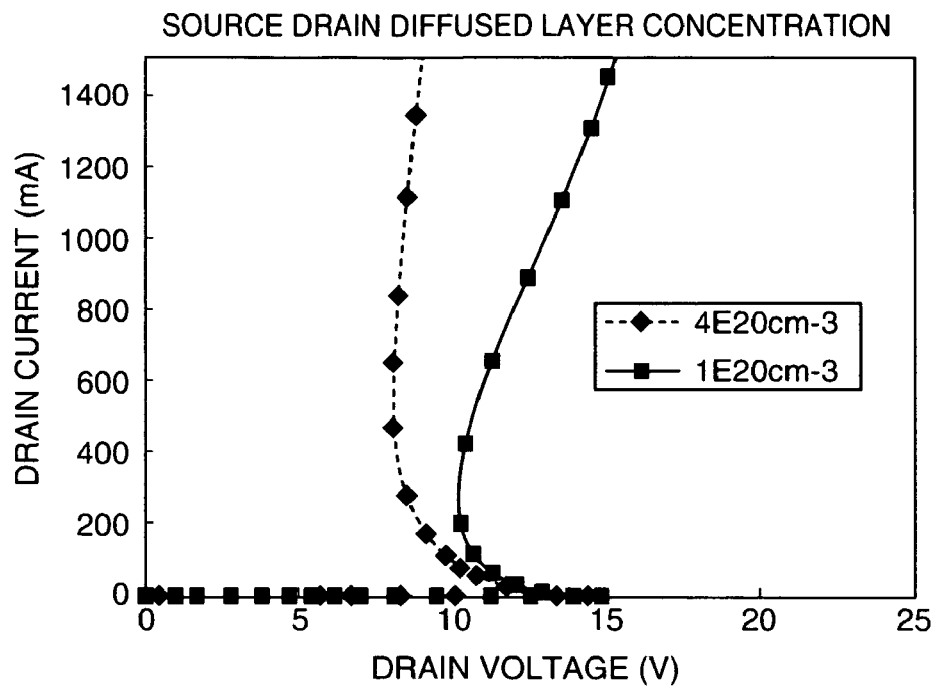
FIG. 3(a) is a diagram showing source-drain diffused layer concentrations as parameters and FIG. 3(b) is a diagram showing substrate resistances as parameters, respectively.
Figure 3B:
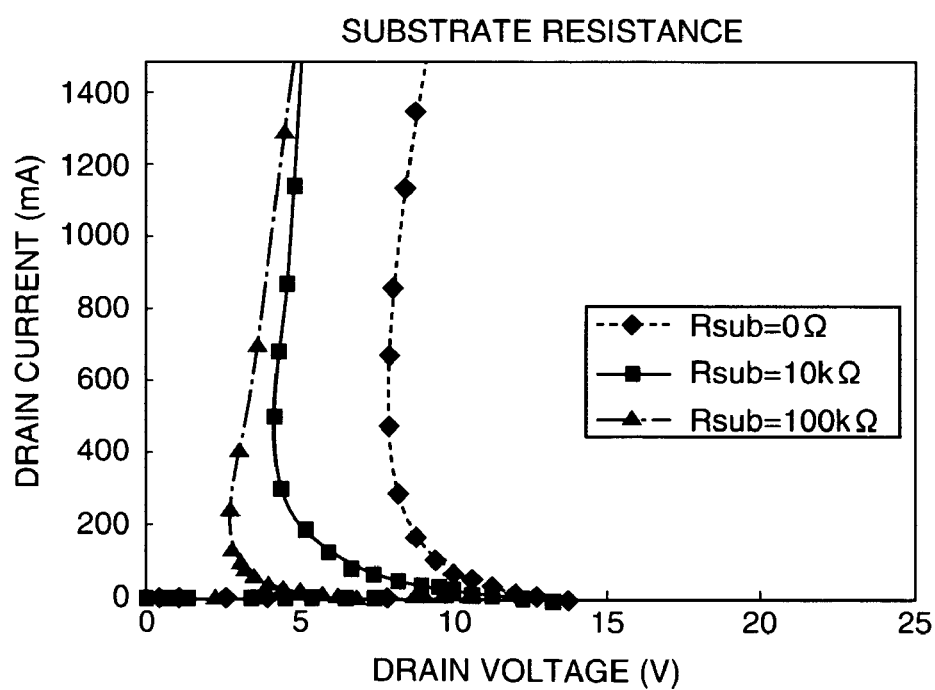

Snapback characteristics about a source-drain diffused layer concentration and a substrate resistance of specific elements are shown in FIGS. 3(a) and 3(b) respectively. It is understood that while, of the snapback characteristics about the specific elements, the snapback characteristic about the source-drain diffused layer concentration shown in FIG. 3(a) is being illustrated with respect to two cases of $4 \times 10^{20}/cm^3$ and $1 \times 10^{20}/cm^3$ as diffused layer concentrations of a source and drain, the on resistance changes with a change in concentration.

It is understood that while the snapback characteristic about the substrate resistance shown in FIG. 3(b) is being illustrated with respect to three cases of 0Ω, 10 kΩ and 100 kΩ as substrate resistances, the snapback characteristic is affected by a hold voltage according to a change in substrate resistance. It is understood that although the impact ionizing coefficient is unillustrated in the drawing, the breakdown voltage changes. Impurity profiles can be extracted by using data about such an ESD protective element modeling method.

That is, the impurity profiles can be analyzed from the snapback characteristics as to an N+ layer and a P+ layer of each MOSFET. The extracted impurity profiles of the MOSFET are ion-implanted simultaneously upon formation of an SCR and identical in annealing process. Therefore, they can be developed into impurity profiles of an SCR structure, and hence an N+ layer and a P+ layer of the SCR can also be evaluated. The whole impurity profile is configured using these information.

Figure 7A:
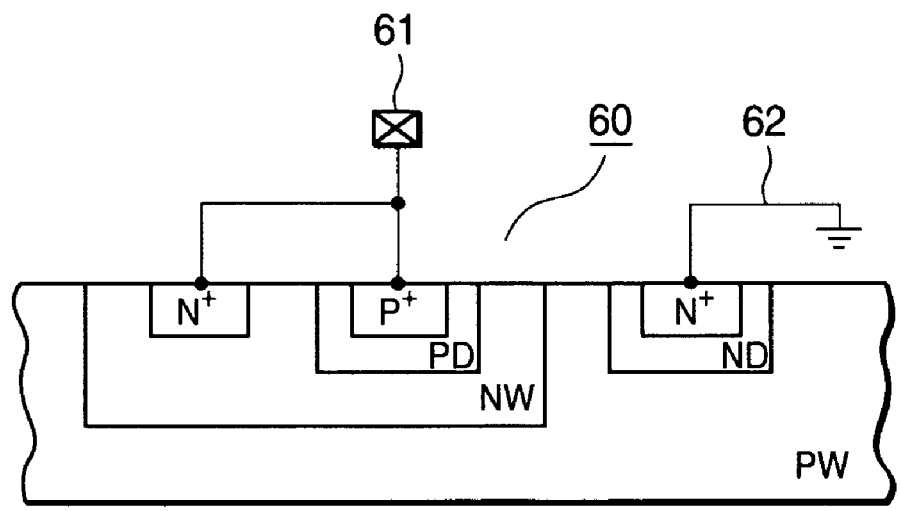
FIG. 7(a) is an explanatory diagram showing a schematic structure of an SCR and FIG. 7(b) is an explanatory diagram showing a schematic structure of an LVTSCR.
Figure 7B:
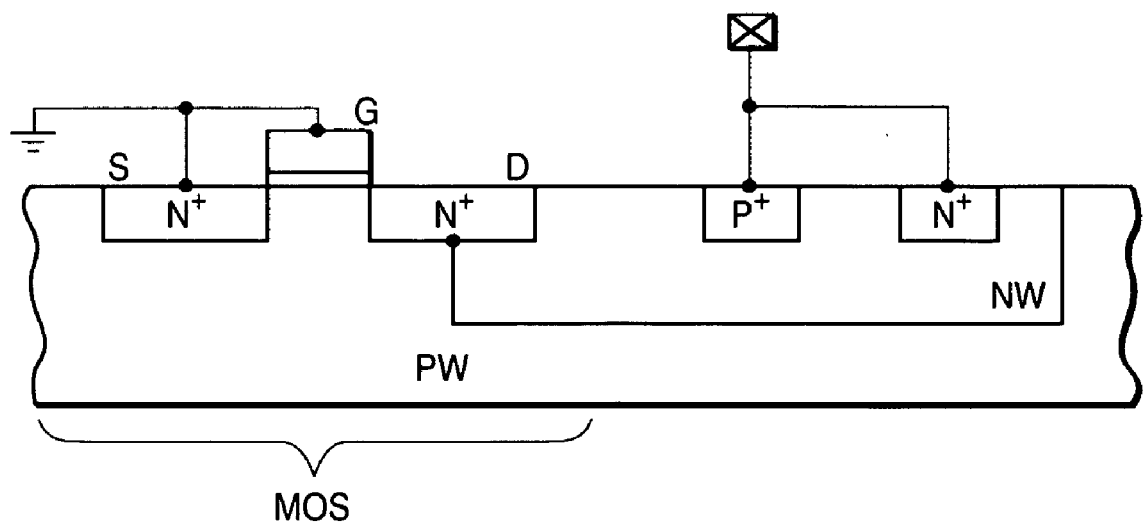

The impurity profiles of the MOSFET are extracted in this way and respectively associated with the impurity profiles of the SCR structure. Thereafter, only parameters peculiar to the SCR element, such as the size of the SCR element (e.g., the distance between junctions, etc.), transverse diffusion of each impurity profile, etc. are fine-adjusted. In an actual process, a thin impurity layer is provided around the N+ layer and P+ layer of the MOSFET for the purpose of field relaxation, and such an impurity profile can also be developed into an SCR (e.g., ND and PN or the like in FIG. 7(a)).

Of course, the evaluating method can be applied even to a structure having a PN layer formed with an impurity layer simultaneously with the MOSFET whose impurity profile is extracted, even at other than the SCR, and other derived structures. Thus, impurity profiles of various ESD protective elements can be evaluated from the electric characteristics of individual MOSFETs formed on the same wafer, and the evaluation of the impurity profiles can be easily carried out.

Second Preferred Embodiment

Figure 4:
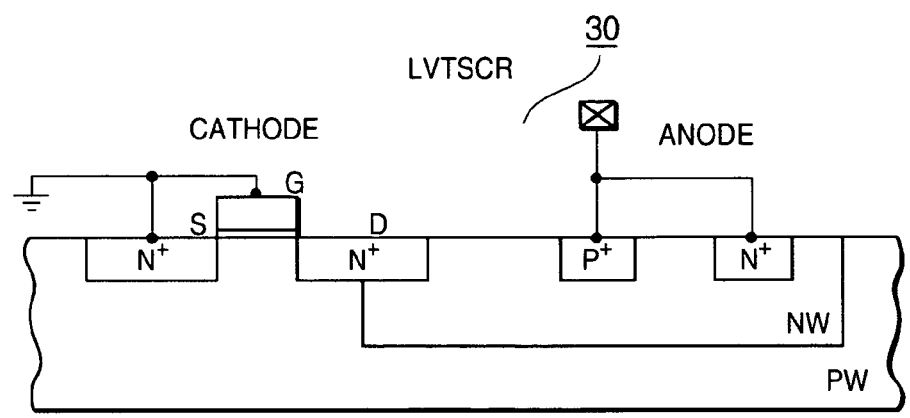
FIG. 4 is an explanatory diagram showing an evaluating method according to a second embodiment of the present invention.
Figure 4:
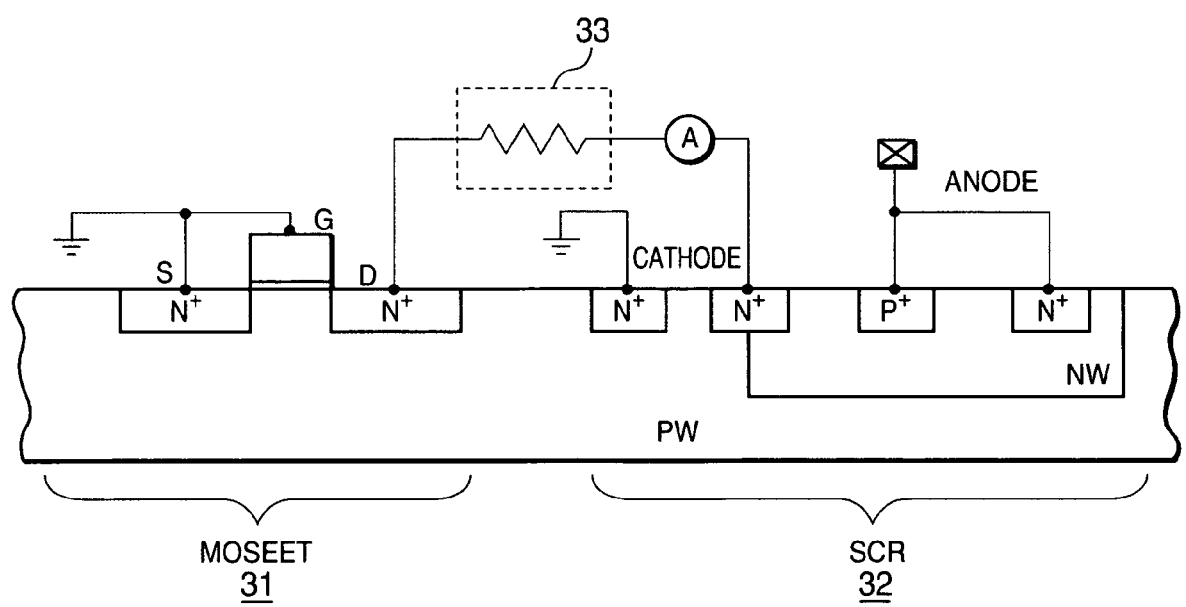

FIG. 4 shows an ESD protective element for describing the present embodiment. The present embodiment illustrates, for example, an LVTSCR 30 reduced in SCR's turn-on voltage with a MOSFET 31 as a trigger, in which the MOSFET 31 and an SCR 32 are formed as single or discrete parts upon wafer fabrication, their characteristics are measured, and thereafter the MOSFET 31 and SCR 32 are connected to each other by a sub circuit 33.

That is, in an ESD protective element comprised of two or more elements as in the case of an SCR containing a MOSFET or a protective element having its derived structure, a decision as to whether the influence of any of plural elements is exerted, is difficult even if the characteristics used as for the ESD protective element are measured, and the evaluation to be made as the ESD protective element was not easy.

Thus, the respective elements are separately formed in such a manner that their characteristics can be measured and evaluated individually. Individually evaluating the MOSFET and the SCR, for example, enables feedback to design and makes it possible to carry out an adjustment for providing a more effective ESD protective element. At this time, impurity profiles of the respective elements may of course be evaluated using the first embodiment.

Thereafter, a drain region for the MOSFET and a cathode region for the SCR are connected to each other by a sub circuit such as a resistor, and the performance of the whole element or device is evaluated. In order to evaluate the influence of breakdown of the SCR on the MOSFET, an ampere meter may be interposed in the sub circuit to monitor its current value.

Further, when the gate width of the MOSFET and the width (deep width) of the SCR are different, there is a need to perform a three-dimensional analysis taking into consideration not only a sectional structure but also a depth upon evaluating them as the ESD protective element. The three-dimensional analysis was very complex and needed time. However, for example, the two elements, i.e., MOSFET and SCR are evaluated in parts to thereby make it possible to evaluate three-dimensional parameters each corresponding to the depth such as the gate width or the like in a cut and divided form. Since the ESD protective element comprised of two elements can be two-dimensionally analyzed, the time required to carry out its analysis can be shortened.

Of course, the present embodiment is not limited to the combination of the MOSFET and SCR either but applicable even to a combination of a PN diode and other elements. Further, the present invention is applicable even to a combination of not only two elements but three or more elements.

Thus, in the ESD protective element having the structure in which at least the two elements are combined, e.g., the SCR combined with the MOSFET, the MOSFET and SCR are separately formed as single or discrete parts and thereafter the two elements are connected using the sub circuit. Therefore, they can be evaluated as discrete elements respectively prior to being connected by the sub circuit, and the evaluation thereof as the ESD protective element also becomes easy. There is a merit that the influence between the respective elements can be evaluated by monitoring the current flowing through the sub circuit and the voltage applied thereto.

Figure 5:
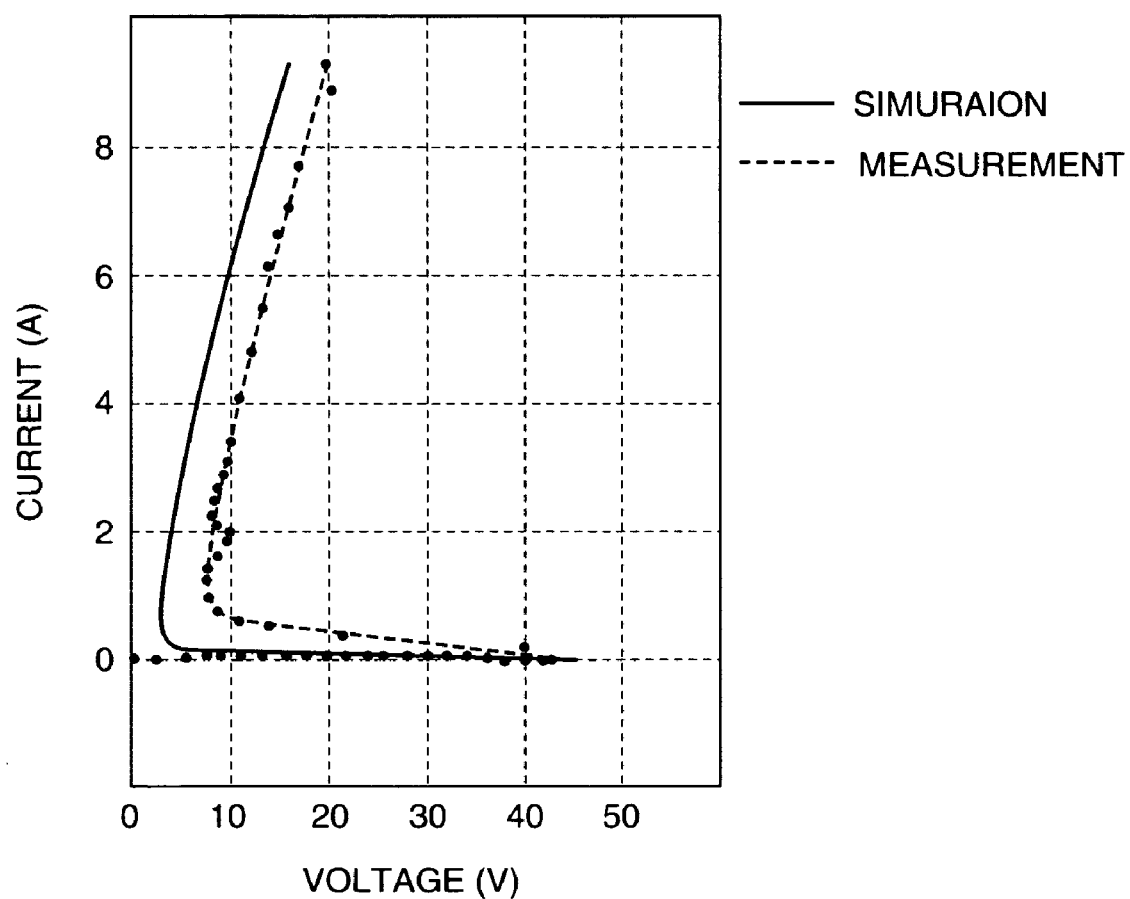
FIG. 5 is an explanatory diagram showing the result of analysis of a snapback characteristic of an ESD protective element by each of the first and second embodiments and actually measured data.
Figure 6A:
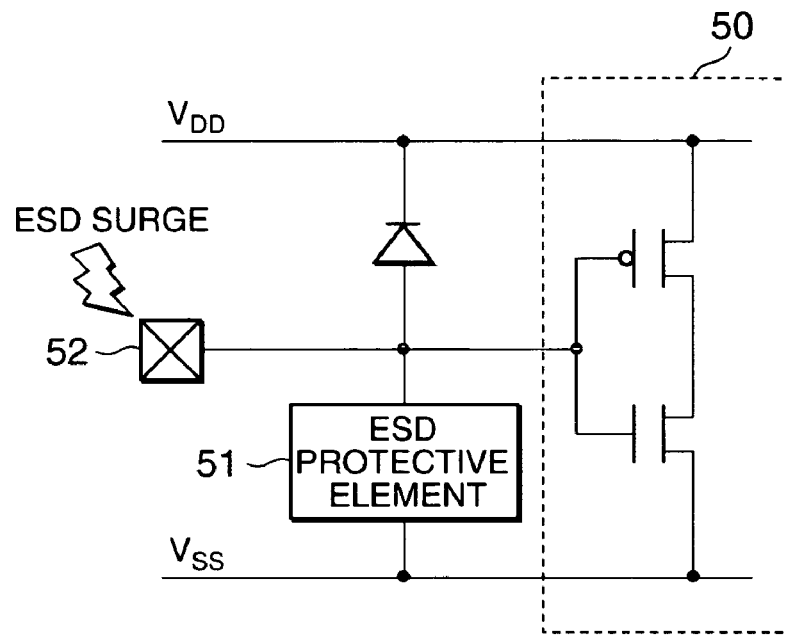
FIG. 6(a) is an input circuit.
Figure 6B:
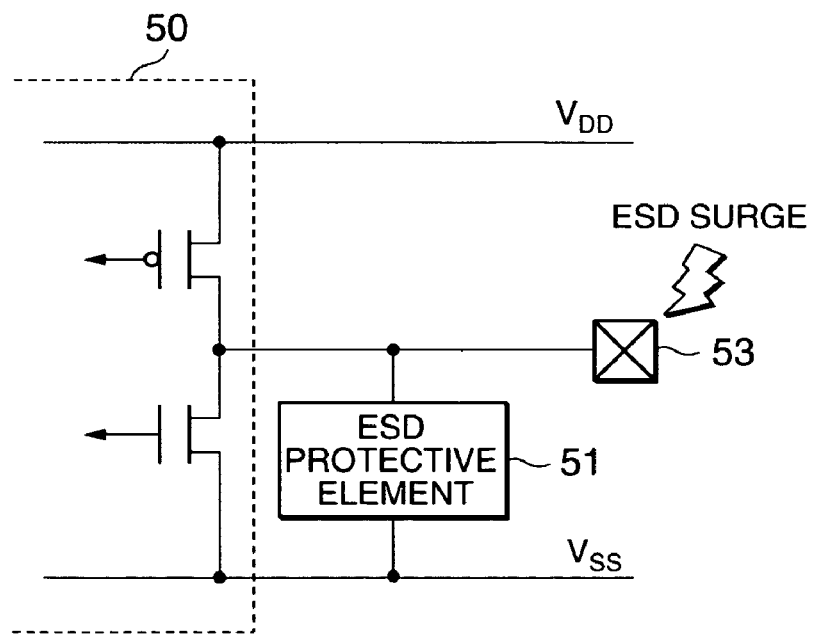
FIG. 6(b) is an output circuit, respectively.

FIG. 5 shows a result obtained by applying the present embodiment to the ESD protective element in which the MOSDET and SCR are combined together and evaluating the snapback characteristic of the ESD protective element by the two-dimensional analysis, using the first embodiment and an actually measured result. A result obtained by forming a MOSFET (whose gate width is 34 μm) and an SCR (whose element width is 29 μm) as single parts and connecting the drain of the MOSFET and the cathode of the SCR by a sub circuit substantially coincides with actually measured data such as a turn-on voltage, an on resistance.

Although the preferred embodiments of the present invention have been described above with reference to the accompanying drawings, it is needless to say that the present invention is not limited to such embodiments. It will be apparent to those skilled in the art that various changes or modifications can be supposed to be made to the invention within the scope described in the claims. It should be understood that those changes or modifications fall within the technical scope of the present invention.

The present invention can be applied to a method of evaluating a semiconductor device, and particularly to a semiconductor device evaluating method which evaluates an impurity profile of an ESD protective element from an electric characteristic of a MOSFET formed on the same substrate.

According to the present invention, as described above in detail, impurity profiles of various ESD protective elements such as an SCR, etc. can be easily evaluated on a non-destructive basis from electric characteristics of MOSFETs formed by using a process similar to the ESD protective elements without using an SIMS measuring TEG or the like. Thus, the impurity concentration and element size of each of the ESD protective elements are optimized efficiently, and thereby a semiconductor device high in ESD resistance can be fabricated.

What is claimed is:

1. A method of evaluating a semiconductor device having an ESD protective element, wherein a MOSFET is formed on the same substrate, comprising the following steps of:
   measuring an electric characteristic of the MOSFET;
   measuring a snapback characteristic of the MOSFET;
   extracting an impurity profile of the MOSFET from the electric characteristic and snapback characteristic of the MOSFET; and
   causing the extracted impurity profile of the MOSFET and an impurity profile of the ESD protective element to correspond to each other.

2. The method according to claim 1, further including a step for adjusting the concentration of an impurity diffused layer of the ESD protective element after the step for allowing the impurity profile of the MOSFET and the impurity profile of the ESD protective element to correspond to each other.

3. The method according to claim 2, wherein the electric characteristic of the MOSFET is obtained by measuring at least a current-voltage characteristic or a capacitance-voltage characteristic.

4. The method according to claim 3, wherein at least a breakdown voltage, a hold voltage or an on resistance is determined from the snapback characteristic of the MOSFET.

5. The method according to claim 4, wherein the MOSFET includes an N channel MOSFET and a P channel MOSFET.

6. The method according to claim 5, wherein the ESD protective element is an SCR.

7. The method according to claim 1, further including a step for adjusting the size of the ESD protective element after the step for causing the impurity profile of the MOSFET and the impurity profile of the ESD protective element to correspond to each other.

8. The method according to claim 7, wherein the electric characteristic of the MOSFET is obtained by measuring at least a current-voltage characteristic or a capacitance-voltage characteristic.

9. The method according to claim 8, wherein at least a breakdown voltage, a hold voltage or an on resistance is determined from the snapback characteristic of the MOSFET.

10. The method according to claim 9, wherein the MOSFET includes an N channel MOSFET and a P channel MOSFET.

11. The method according to claim 10, wherein the ESD protective element is an SCR.

* * * * *